United States Patent
Rentschler et al.

(10) Patent No.: US 7,289,587 B2
(45) Date of Patent: Oct. 30, 2007

(54) REPEATABILITY OVER COMMUNICATION LINKS

(75) Inventors: Eric M. Rentschler, Fort Collins, CO (US); Samuel D. Naffziger, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 191 days.

(21) Appl. No.: 10/830,367

(22) Filed: Apr. 22, 2004

(65) Prior Publication Data

US 2005/0240698 A1  Oct. 27, 2005

(51) Int. Cl.
*H04L 7/04* (2006.01)
*G06F 13/14* (2006.01)
*H03K 19/0175* (2006.01)

(52) U.S. Cl. ............ 375/362; 375/356; 710/305; 326/86

(58) Field of Classification Search ............. 710/305; 375/257; 370/274
See application file for complete search history.

(56) References Cited

U.S. PATENT DOCUMENTS

| | | | |
|---|---|---|---|
| 3,715,679 A * | 2/1973 | Fleischer | 330/107 |
| 6,536,025 B2 * | 3/2003 | Kennedy et al. | 716/6 |
| 6,851,009 B1 * | 2/2005 | Regula | 710/305 |
| 2004/0081246 A1 * | 4/2004 | Bazes | 375/257 |

* cited by examiner

*Primary Examiner*—Vibol Tan (57) ABSTRACT

Systems, methods, and other embodiments associated with a repeatable communication system are disclosed. One example system for receiving signals from an electronic component over a plurality of point-to-point communication links comprises a repeatability logic operably connected to each of the plurality of point-to-point communication links and configured to apply a delay offset to the signals received to compensate for frequency changes in signal transmissions over the plurality of point-to-point communication links.

30 Claims, 7 Drawing Sheets

| Link Length (inches) | Shift Register Depth | | | | |
|---|---|---|---|---|---|
| | $f_{range} = 1.0$ GT/s | $f_{range} = 1.5$ GT/s | $f_{range} = 2.0$ GT/s | $f_{range} = 2.5$ GT/s | $f_{range} = 3.0$ GT/s |
| 5 | 1 | 2 | 2 | 3 | 3 |
| 10 | 2 | 3 | 4 | 5 | 6 |
| 15 | 3 | 5 | 6 | 8 | 9 |
| 20 | 4 | 6 | 8 | 10 | 12 |
| 25 | 5 | 8 | 10 | 12 | 15 |
| 30 | 6 | 9 | 12 | 15 | 17 |
| 35 | 7 | 10 | 14 | 17 | 20 |
| 40 | 8 | 12 | 15 | 19 | 23 |

REPEATABILITY OVER COMMUNICATION LINKS

BACKGROUND

Computer systems are changing in the way internal components are connected. Internal components may include processors, memory controllers, and I/O controllers. Many systems connect their components with a wide, synchronous multi-drop bus. However, configurations are changing to use high-speed, narrow point-to-point links. One reason for the change is that the multi-drop bus approach is becoming a performance limitation. The point-to-point links approach presents new challenges for chip and system designer such as repeatability for varying clock operating frequencies.

BRIEF DESCRIPTION OF THE DRAWINGS

The accompanying drawings, which are incorporated in and constitute a part of the specification, illustrate various example systems, methods, and so on that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

The following includes definitions of selected terms employed herein. The definitions include various examples and/or forms of components that fall within the scope of a term and that may be used for implementation. The examples are not intended to be limiting. Both singular and plural forms of terms may be within the definitions.

"Computer-readable medium", as used herein, refers to a medium that participates in directly or indirectly providing signals, instructions and/or data. A computer-readable medium may take forms, including, but not limited to, non-volatile media, volatile media, and transmission media. Non-volatile media may include, for example, optical or magnetic disks and so on. Volatile media may include, for example, optical or magnetic disks, dynamic memory and the like. Transmission media may include coaxial cables, copper wire, fiber optic cables, and the like. Transmission media can also take the form of electromagnetic radiation, like those generated during radio-wave and infra-red data communications, or take the form of one or more groups of signals. Common forms of a computer-readable medium include, but are not limited to, a floppy disk, a flexible disk, a hard disk, a magnetic tape, other magnetic medium, a CD-ROM, other optical medium, punch cards, paper tape, other physical medium with patterns of holes, a RAM, a ROM, an EPROM, a FLASH-EPROM, or other memory chip or card, a memory stick, a carrier wave/pulse, and other media from which a computer, a processor or other electronic device can read. Signals used to propagate instructions or other software over a network, like the Internet, can be considered a "computer-readable medium."

"Data store", as used herein, refers to a physical and/or logical entity that can store data. A data store may be one or more of, for example, a database, a table, a file, a list, a queue, a heap, a memory, a register, and so on. A data store may reside in one logical and/or physical entity and/or may be distributed between two or more logical and/or physical entities.

"Logic", as used herein, includes but is not limited to hardware, firmware, software and/or combinations of each to perform a function(s) or an action(s), and/or to cause a function or action from another component. For example, based on a desired application or needs, logic may include a software controlled microprocessor, discrete logic like an application specific integrated circuit (ASIC), a programmed logic device, a memory device containing instructions, or the like. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communication flow, and/or logical communication flow may be sent and/or received. Typically, an operable connection includes a physical interface, an electrical interface, and/or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic device, software, or other entity. Logical and/or physical communication channels can be used to create an operable connection.

"Signal", as used herein, includes but is not limited to one or more electrical or optical signals, analog or digital signals, data, one or more computer or processor instructions, messages, a bit or bit stream, or other means that can be received, transmitted, and/or detected.

"Software", as used herein, includes but is not limited to, one or more computer or processor instructions that can be read, interpreted, compiled, and/or executed and that cause a computer, processor, or other electronic device to perform functions, actions and/or behave in a desired manner. The instructions may be embodied in various forms like routines, algorithms, modules, methods, threads, and/or programs including separate applications or code from dynamically linked libraries. Software may also be implemented in a variety of executable and/or loadable forms including, but not limited to, a stand-alone program, a function call (local and/or remote), a servelet, an applet, instructions stored in a memory, part of an operating system or other types of executable instructions. It will be appreciated by one of ordinary skill in the art that the form of software may be dependent on, for example, requirements of a desired application, the environment in which it runs, and/or the desires of a designer/programmer or the like. It will also be appreciated that computer-readable and/or executable instructions can be located in one logic and/or distributed between two or more communicating, co-operating, and/or parallel processing logics and thus can be loaded and/or executed in serial, parallel, massively parallel and other manners.

Suitable software for implementing the various components and logics of the example systems and methods described herein may include programming languages and tools like Java, Pascal, C#, C++, C, CGI, Perl, SQL, APIs, SDKs, assembly, firmware, microcode, and/or other languages and tools. Software, whether an entire system or a component of a system, may be embodied as an article of manufacture and maintained and/or transmitted as part of a computer-readable medium as defined previously. Another form of the software may include signals that transmit program code of the software to a recipient over a network or other communication medium. Thus in one example, a computer-readable medium has a form of signals that represent the software/firmware as it is downloaded from a web server to a user. In another example, the computer-readable medium has a form of the software/firmware as it is maintained on the web server. Other forms may also be used. It will be appreciated that all components described herein may be implemented as separate components or may be combined together.

"User", as used herein, includes but is not limited to one or more persons, software, computers or other devices, or combinations of these.

Some portions of the detailed descriptions that follow may be presented in terms of algorithms and symbolic representations of operations on data bits within a memory or other logic. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, instructions, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, applying, displaying, or the like, refer to actions and/or processes of a computer system, logic, processor, circuit, or similar electronic device that can manipulate and transform data represented as physical (electronic) quantities.

Described herein are example systems, methods, and other embodiments associated with designing, manufacturing, testing, and/or debugging of communication configurations and logic devices that have communication link repeatability. For example, in a computing device, internal components can be connected to each other using a variety of data transfer structures like point-to-point links. For purposes of the following examples, the internal components can include, without limitation, processors, memory controllers, input/output (I/O) controllers, logic devices, circuits, and/or any electronic device that can be connected to a communication link such as a bus. Components that are connected by point-to-point links are configured to transmit and receive signals using a selected clock operating frequency or range of operating frequencies. The term "operating frequency" will also be used interchangeably with "transmission frequency," "signal transmission frequency," "link frequency," and the like.

Maintaining link repeatability between components is challenging since the behavior or response of a component may change as the operating frequency changes. Testing and/or debugging systems become more difficult when conditions change. As one explanation, link repeatability is a link feature that fixes the link transfer latency in terms of clock cycles over a range of clock operating frequencies so that the behavior of a component is consistent for a set of stimuli even at different operating frequencies.

In one example system described herein, where two electronic components are in communication with each other, the system may include a de-skew mechanism configured to offset signals received over each communication link in order to re-align bits that are transmitted together so that they are read together. A repeatability logic can also be included that is configured to apply a delay offset (also referred to as a repeatability offset) to the bits received which is based on the operating frequency. If a different operating frequency is used, the repeatability logic can apply a different value for the delay offset such that the behavior or response of a component that receives signals is the same behavior or response that is observed for different operating frequencies or ranges.

As another example, having link repeatability can impact test and debug usage models. In a first model, during silicon debug on test analyzers, various parts of a component under test can be tested by using test vectors generated from pre-silicon validation. The test vectors are used to stimulate the component and its response is observed. Without link repeatability, different sets of test vectors would be required for different link frequencies. In other words, if the link frequency changes, the same test vector would not produce the same behavior or response from a component. Thus, different test vectors would be needed for different link operating frequencies. With the present systems and methods, link repeatability can be achieved and only one set of test vectors could be used over a range of link frequencies. This can represent a savings in test vector development time. It also can make the debug process more straight-forward, providing the ability to see where one particular vector set fails over frequency. Being able to use a single vector set can also reduce manufacturing cost since test vectors are run on wafers to screen parts or components within the manufacturing process.

In the second usage model, during system validation, engineers typically root-cause bugs that are detected. Frequency shmooing is a technique that can be used. In this technique, a test engineer would shmoo (vary) the operating frequency over a range to determine if a bug is related to speed. To enable frequency shmooing, the component under test should behave identically at different frequency points within the frequency range of interest. In some systems, this condition is often not satisfied because input/output (I/O) behaviors of components change as the clock frequency changes.

At some frequency points, where testing would have normally have had to transition from one test vector set to another, there could be frequency ranges that a tester would want to stay away from. For example, there may not be clear pass/fail conditions for the frequency range and it may be difficult to troubleshoot for problems. With the present systems and methods as described below, link repeatability can be achieved such that the behavior of components can be made to be substantially consistent/constant as the clock frequency changes.

The present systems and methods can provide link repeatability that can also be used in building fault-tolerant systems. For example, socket level determinism (e.g. repeatability) is desired to build lock-step systems. Although link repeatability alone does not provide for absolute socket level determinism, it is a factor. Link repeatability can better ensure that two components running at a fixed, even frequency ratio exhibit identical cycle-to-cycle link behaviors.

Figure 1:
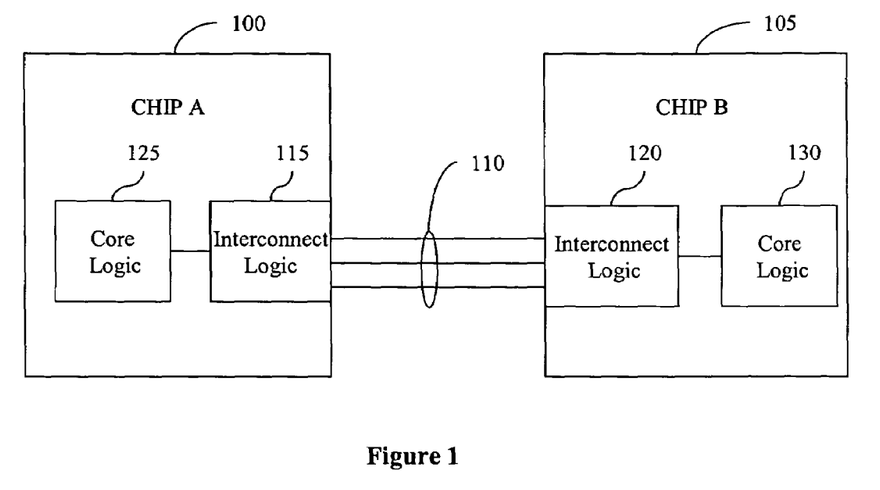
FIG. 1 illustrates an example diagram of two components in communication with each other that can apply a delay offset to communicated signals.

Illustrated in FIG. 1 is an example block diagram of two electronic components that are connected to one another using one or more communication links. For example, chip A 100 is connected to chip B 105 using one or more point-to-point links 110 that may be high speed serial links. Each chip includes an interconnect logic 115, 120, respectively, that is configured to control signal transmission and/or reception over the point-to-point links 110. Each chip is also shown with a core logic 125, 130, respectively, which generically represents the logic implemented in the chip to perform its designed function(s). The core logic 125, 130 is not important to this discussion and will not be described in further detail.

As a general example, when in the interconnect logic 115 is in a transmission state, the interconnect logic 115 would receive signals from its core logic 125, process the signals into an appropriate communication format if needed, and transmit the signals on the point-to-point links 110 to chip B 105. The interconnect logic 120 would change to a receiving state where it can read the signals from the links 110, process the signals from the communication format to a format for the core logic 130, and provide the signals to its core logic 130. The reverse scenario can also apply.

In one embodiment, the interconnect logic 120, can be configured to apply a delay offset to the signals received where the delay offset is based on the transmission frequencies or clock operating frequencies used. By changing the delay offset, repeatable behavior of a chip or other component can be achieved when the operating frequencies change. In another example, the delay offsets can be based on a selected clock operating frequency range and a link length of the point-to-point links 110 between chip A 100 and chip B 105. In general, the longer the link length, the more difficult it is for the system to tolerate frequency changes and the greater the delay offset may need to be.

Referring to interconnect logic 120 but which can apply to any similar logic described herein, in one example the interconnect logic 120 may include a packet assembler/disassembler (PAD) that is not illustrated. The PAD can be a hardware and/or software device configured to split a data stream(s) into discreet packets for transmission over the links 110 and then reform the data stream(s) at a receiving end. In other words, the PAD can assemble data into packets for transmission and disassembles the packets on arrival so the data can be used by the core logic. By applying a delay offset to the signals received in the interconnect logic 120, the system can cause a total delay between chip A 100 and chip B 105 to be a constant number of clock cycles from the reference point of the core logic 125 or 130. For example, the total delay is the time from when the core logic 125 sends a signal to when the core logic 130 receives the signal. As will be described in greater detail below, the amount of the delay offset can be changed with different selected operating frequency ranges.

In one example configuration, the core logic 125 and/or 130, can include a fixed clock domain that is a synchronous clock domain which may apply to the entire core logic or at least a large portion of the logic. The PAD, however, may include many asynchronous logic components and varying clock domains relative to the core logic clocks. The PAD within the interconnect logic 115, 120, can be configured to abstract out data signals to send/receive data and control the signal delay. In one example, a buffering logic for repeatability (which will be described in greater detail below) can be included in the PAD or other component of the interconnect logic 115, 120 that makes the delay between components constant at least over a range of operating conditions/frequencies.

Figure 2:
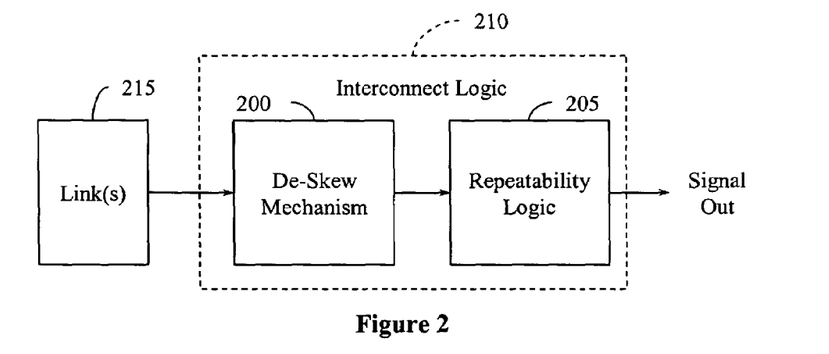
FIG. 2 illustrates an example system diagram of an interconnect logic.

Illustrated in FIG. 2 is an example of a signal processing system that can include a de-skew mechanism 200 and a repeatability logic 205. One or both of these components can be regarded as the buffering logic and can be part of an interconnect logic 210 that is configured to communicate with a link 215. The interconnect logic 210 can be implemented as previously described with reference to interconnect logic 115 or 120. The interconnect logic 210 may include a signal transceiver and any desired logic and/or functionality to process signals with the link 215. In the following example, the de-skew mechanism 200 and the repeatability logic 205 are configured to process signals received from the link 215 and to produce a corresponding signal out. It will be appreciated that the link 215 generally can represent one or more point-to-point links between two electronic components.

With further reference to FIG. 2, as signals are received from the link 215, the de-skew mechanism 200 is configured to apply a bit-to-bit shift to realign the received bits. For example, the de-skew mechanism 200 can include one or more shift registers and may be a multidimensional shift register based on the number of links and the amount of shift desired. To determine an appropriate bit offset for the de-skew mechanism 200, a reset process can be performed (also called links configuration or link layer configuration) during the design and manufacturing of the system to determine how bits are skewed when transmitted over the links 215. For example, a predetermined bit pattern (e.g., a test vector of all "0" bits) can be transmitted from one component to the other and then the bit pattern can be changed to all "1" bits. The transition of the bit values can then be observed at the receiving end and a bit offset value can be determined for each link that is needed to re-align the received bit so that a set of bits that are transmitted together are properly read together by the receiving component. The bit offset value, however, is determined based on certain system conditions which include a certain clock operating frequency. If the operating frequency changes, the bit offset values for the links may also change.

To address frequency changes, the repeatability logic 205 can be configured to provide an additional offset based on the clock operating frequency. For example, the repeatability logic 205 can apply different values for a repeatability offset or delay offset that can be changed based on the operating frequency. The repeatability offset is applied to all links 215 equally so that a total delay between the components is constant or substantially constant.

Figure 3:
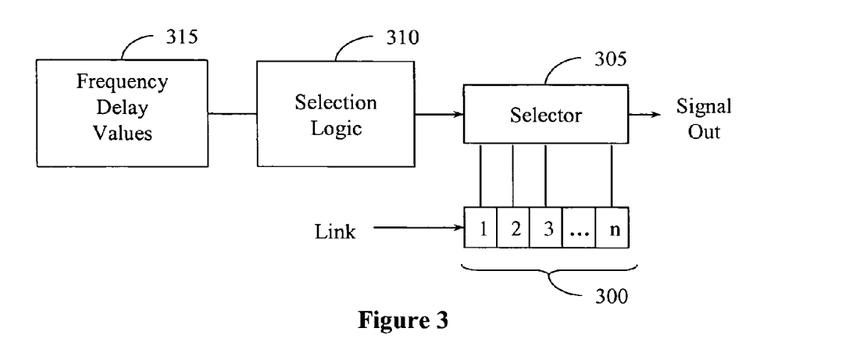
FIG. 3 illustrates one example of a combined bit de-skew and delay offset logic.
Figure 5:
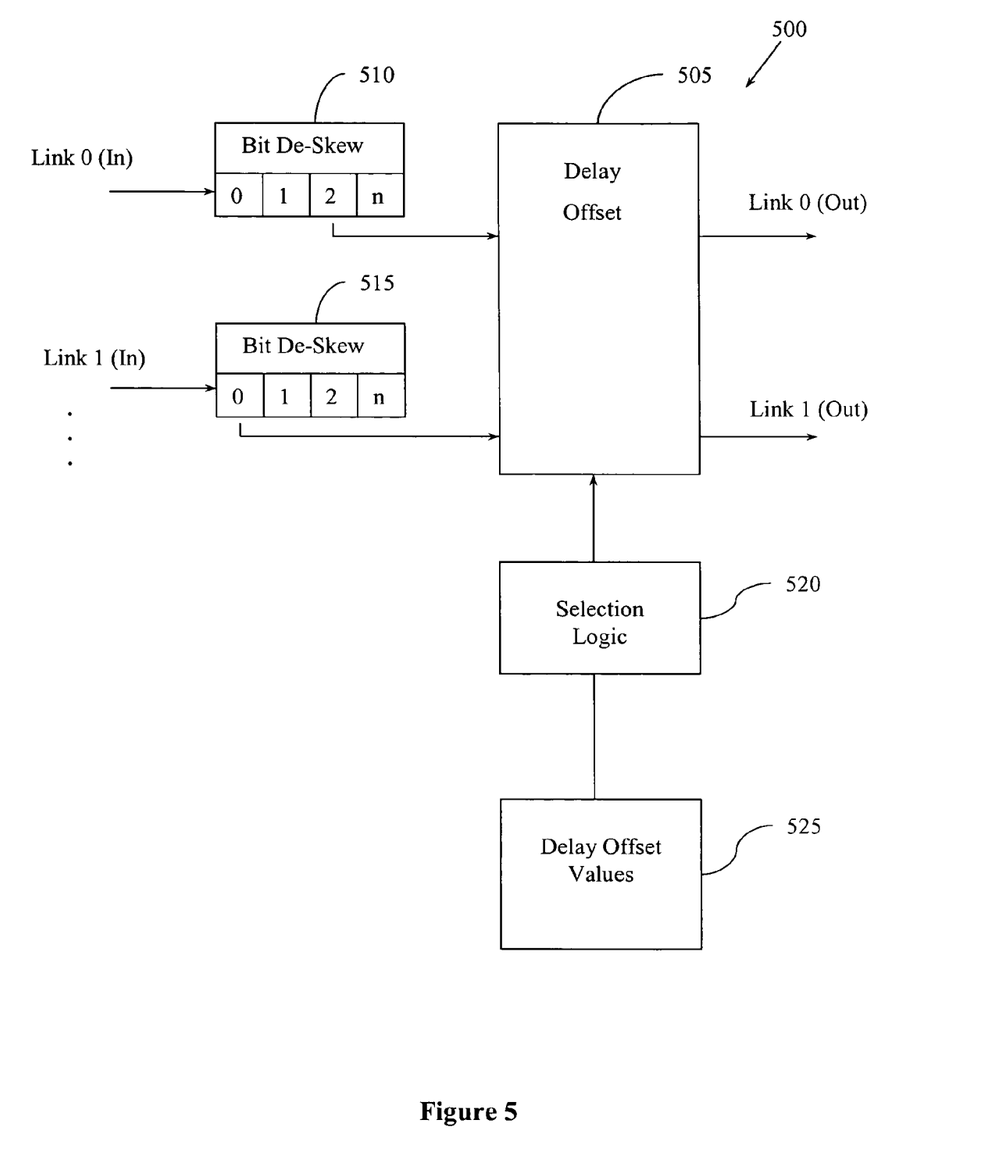
FIG. 5 illustrates one example of separate bit de-skew and frequency logics.

In one implementation, the de-skew mechanism 200 and repeatability logic 205 can be designed as a single shift register that is operably connected to each link. The depth of the shift register can be determined based on the number of bit offsets needed for the de-skew mechanism 200 and a desired range of frequencies for the repeatability logic 205. One example of this implementation is shown in FIG. 3. Another example implementation may include a design where the de-skew mechanism 200 is separate from the repeatability logic 205. One example is illustrated in FIG. 5.

The different values for the repeatability offset can be determined, for example, by running tests on a given system at different operating frequencies to determine how the frequencies affect signal communication. Also, the tests can be performed using different link lengths between the two connected components. In general, as the link length between components increases, a larger shift register may be needed in order to accommodate a greater variety of repeatability offset values for different operating frequency ranges. An example shift register depth table 900 is illustrated in FIG. 9 that shows example frequency ranges, corresponding link lengths in inches, and a corresponding shift register depth that can be used to implement the de-skew mechanism 200 and the repeatability logic 205.

Figure 9:
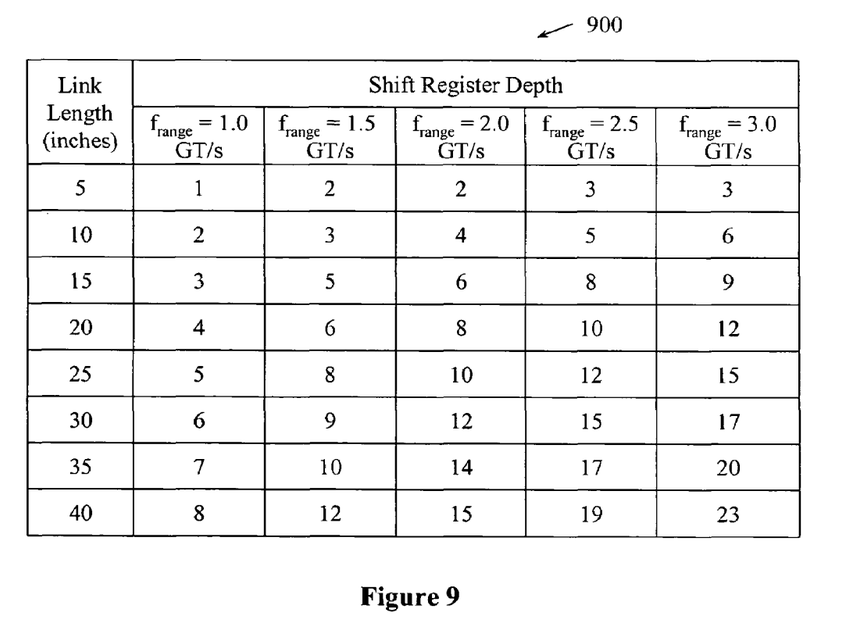
FIG. 9 illustrates an example table of shift register depths for different frequency ranges and link lengths.

In the table 900 of FIG. 9, $f_{range}$ represents a frequency range calculated from a difference between a high frequency used to a low frequency used (e.g. $f_{range}=f_{high}-f_{low}$. The term GT/s stands for giga-transfers per second and assume 1/v is approximately 187 pS/inch. Referring to the table and looking at a frequency range of 1.5GT/s and a link length of 10 inches, a 3-bit deep shift register can be used to provide additional bit offsets for that frequency range. Thus, in one example, if the de-skew mechanism 200 is configured with 8 bits of shift, an 11-bit shift register (8+3) can be used for bit de-skew and delay offset.

It will be appreciated that the shift register can have a varying width based on the number of links. It will also be appreciated that the values shown in FIG. 9 represent only example values and that actual values will be dependent on specific system conditions and/or circuit configurations used. Values for the repeatability offset can be stored in any desired data store such as one or more registers. The values can then be configured to be readable and used to programmatically change the configuration of the repeatability logic 205 to apply different values for the repeatability offset. The repeatability logic 205 can also be selectively enabled and disabled to turn on or off the repeatability offset.

Illustrated in FIG. 3 is one example of a single shift register 300 that can be used to implement both the bit-to-bit de-skew and the repeatability/delay offset for a given communication link. The shift register 300 can have a depth of 0 to n bits, and may be one or more bits wide to accommodate multiple links if desired. In the illustrated example, the shift register 300 is configured for each link. A selector 305 can be configured to tap a selected location from the shift register 300 to read out a bit value which becomes a signal out. The selector 305 can be implemented in any desired type of logic such as a multiplexer. A selection logic 310 can be configured to control the selector 305 by changing the location in the shift register 300 from which to read. By changing the read location (also known as a tap location) a different offset can be applied to bits received over the link. One or more frequency delay values 315 can be maintained, and selectively retrieved by the selection logic 310 to determine the tap location. For example, based on the operating frequency used, a different frequency delay value can be applied to the selector 305. The selection logic 310 can also selectively enable and disable the frequency delay to reduce signal latency if desired.

Figure 4:
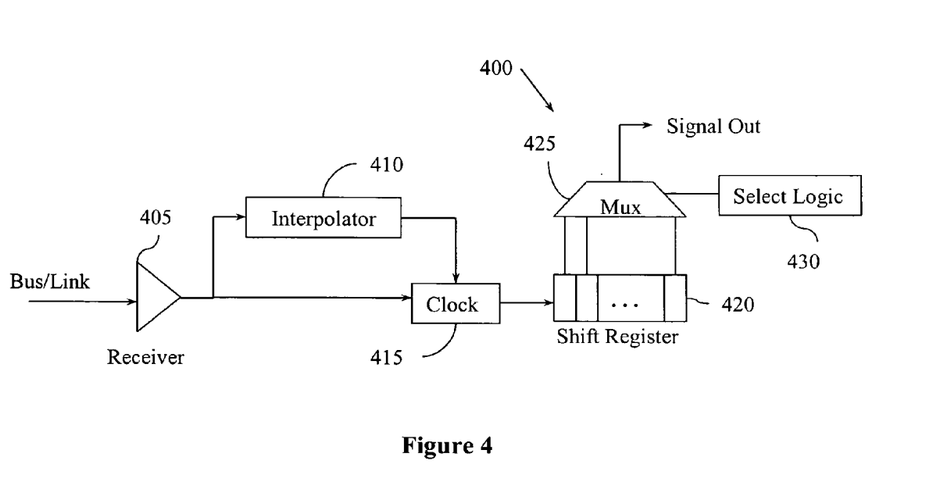
FIG. 4 illustrates another example configuration of FIG. 3.

Illustrated in FIG. 4 is an example of a signal receiving and processing system that can offset signals based on frequency and is a variation of the system in FIG. 3. The system 400 can be implemented in an interconnect logic, a PAD, other logic device for communicating signals with a communication link, or the like. Signals coming from a bus or link can be received by a receiver 405 or other type of buffering logic. With asynchronous communication, the signal can include a data stream that is analyzed by an interpolator 410. The interpolator 410 can be configured to determine the clock cycle based on the data stream and how data corresponds to clock edges. The determined clock cycle can then used to control a clock 415 that clocks the received data to a shift register 420. The shift register 420 is configured to implement the previously described bit-to-bit de-skew mechanism and the repeatability logic to provide both a bit-to-bit offset and a frequency delay offset. A multiplexer 425 is configured to tap a selected location from the shift register 420 in accordance with control signals from a selection logic 430 that can be configured similarly to the selection logic 310 from FIG. 3. From the tap location, a signal out is provided from the multiplexer 425.

Illustrated in FIG. 5 is another example of a repeatability logic 500 that can be configured to apply a delay offset 505 to signals received over one or more links, e.g. link 0, link 1, etc. In this example, the delay offset 505 is configured as a separate component from bit de-skew registers 510 and 515, where a separate bit de-skew register can be used for each link. Of course any number of links and bit de-skew registers can be used. In another example, a multidimensional bit de-skew shift register can be used for multiple links. The bit de-skew can also be implemented in any type of logic desired.

For each link, a selected bit location is tapped out of each bit de-skew register 510, 520 to read out the bit value. Tapping from a different location results in a bit-to-bit de-skew for each link. For example, in bit de-skew register 510, location "2" is being tapped to read the value. The delay offset 505 can then be equally applied to all tapped bit values to provide an additional offset based on frequency. Although the bit de-skew can be a different value for each link, the delay offset 505 is the same value for all links. A corresponding output signal link 0 (out), link 1 (out), is then output for each input link.

A selection logic 520 can be provided to selectively enable and disable the application of the delay offset 505 and to change the value of the delay offset 505 programmatically based on the frequency used. Optionally, one or more delay offset values 525 can be maintained that correspond to selected frequency ranges. For a selected frequency range, the selection logic 525 can apply an appropriate delay offset to ensure repeatability of system behavior as the frequency changes. In one example, the delay offset 505 can be implemented using one or more shift registers or any desired logic that can provide an offset to the signals. As previously described, the delay offset 505 can be set when a circuit or device is being configured. Offset values can be selected from a predetermined table 900 of values as in FIG. 9 which can be determined from tests using different operating frequency ranges and link lengths.

Figure 6:
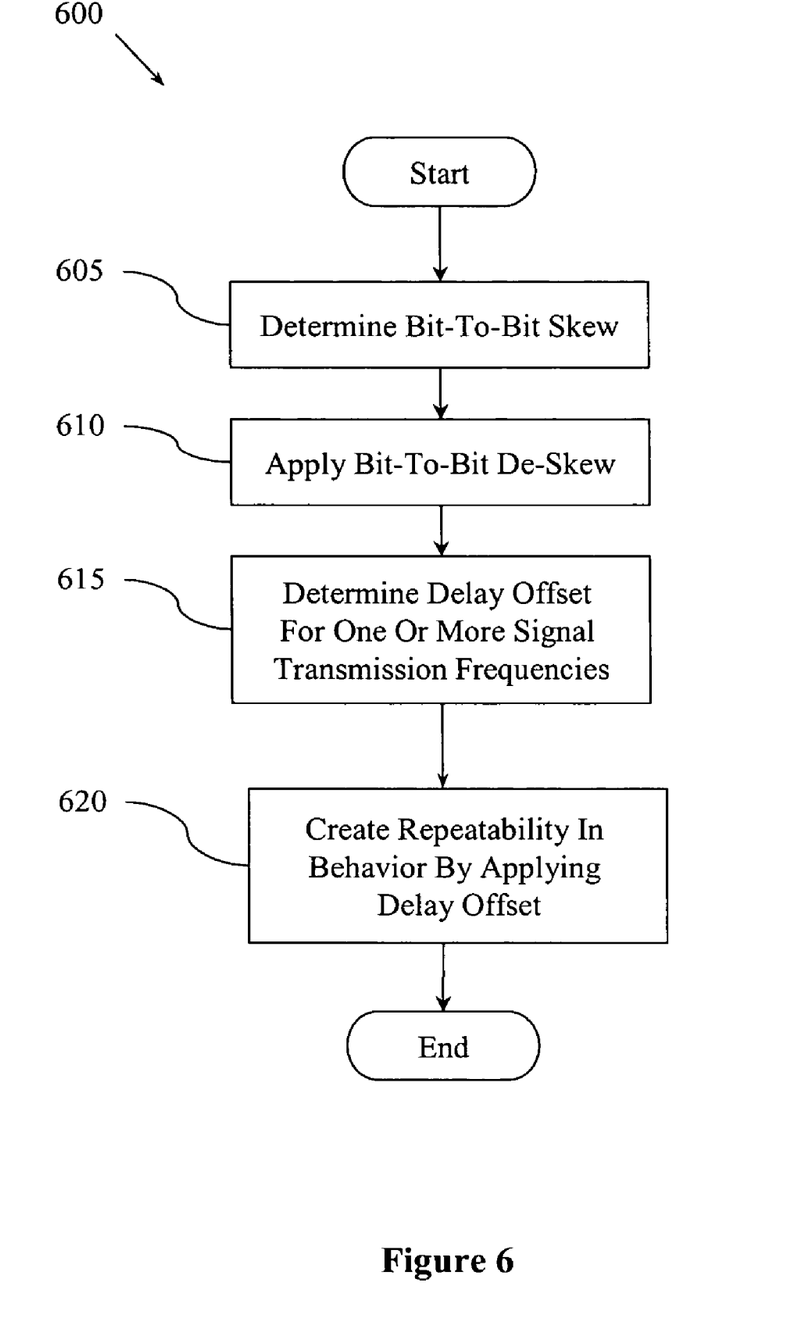
FIG. 6 illustrates an example methodology for designing/configuring a device for communication.

Illustrated in FIG. 6 is one example of a methodology 600 that may be used for testing and/or debugging electronic components in communication by point-to-point links that include any one of the repeatable systems described herein or any combination of the systems. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less or more than all the illustrated blocks may be used to implement an example methodology. Furthermore, additional and/or alternative methodologies can employ additional, not illustrated blocks.

In the flow diagrams, blocks denote "processing blocks" that may be implemented with logic. A flow diagram does not depict syntax for any particular programming language, methodology, or style (e.g., procedural, object-oriented) if applicable to software or firmware implementations. Rather, a flow diagram illustrates functional information one skilled in the art may employ to develop logic to perform the illustrated processing. It will be appreciated that in some examples, program elements like temporary variables, routine loops, and so on are not shown. It will be further appreciated that electronic and software applications may involve dynamic and flexible processes so that the illustrated blocks can be performed in other sequences that are different from those shown and/or that blocks may be combined or separated into multiple components. It will be appreciated that the processes may be implemented using various programming approaches like machine language, firmware, procedural, object oriented, and/or artificial intelligence techniques. The various actions illustrated and/or described herein can occur in serial, but also various actions could occur substantially in parallel.

It will be appreciated that the methodology 600 and the other methodologies described herein can be embodied as processor-executable instructions provided by a computer-readable medium. For example, processor-executable instructions can be provided that are configured to cause a computing device or other logic to respond and/or behavior in a desired manner.

With reference to FIG. 6, to configure the signal receiving logic of an electronic component, a bit-to-bit skew is determined that may occur over the point-to-point links (Block 605). The skew can be determined, for example, by performing a link layer configuration or reset process as previously described. Once determined, the bit-to-bit de-skew can be applied to each link as needed (Block 610). A frequency shift or offset can be determined for one or more signal transmission (clock) frequencies that are used (Block 615). One example of determining the delay offset can be by using previously obtained data such as from a predetermined table 900 shown in FIG. 9. As previously described, for example, determining the delay offset for a given communication link configuration may be obtained by performing one or more tests over the communication links under a variety of operating conditions such as different clock frequencies and different link lengths between components. The process 600 can create repeatability in behavior by applying the delay offset to the signals received by a component (Block 620).

Optionally, the delay offset can be programmatically changed based on the operating frequency or the range of operating frequency where repeatability is desired. The delay offset can also be selectively enabled and disabled if desired. For example, it may be beneficial to disable the delay offset in order to reduce signal latency.

Figure 7:
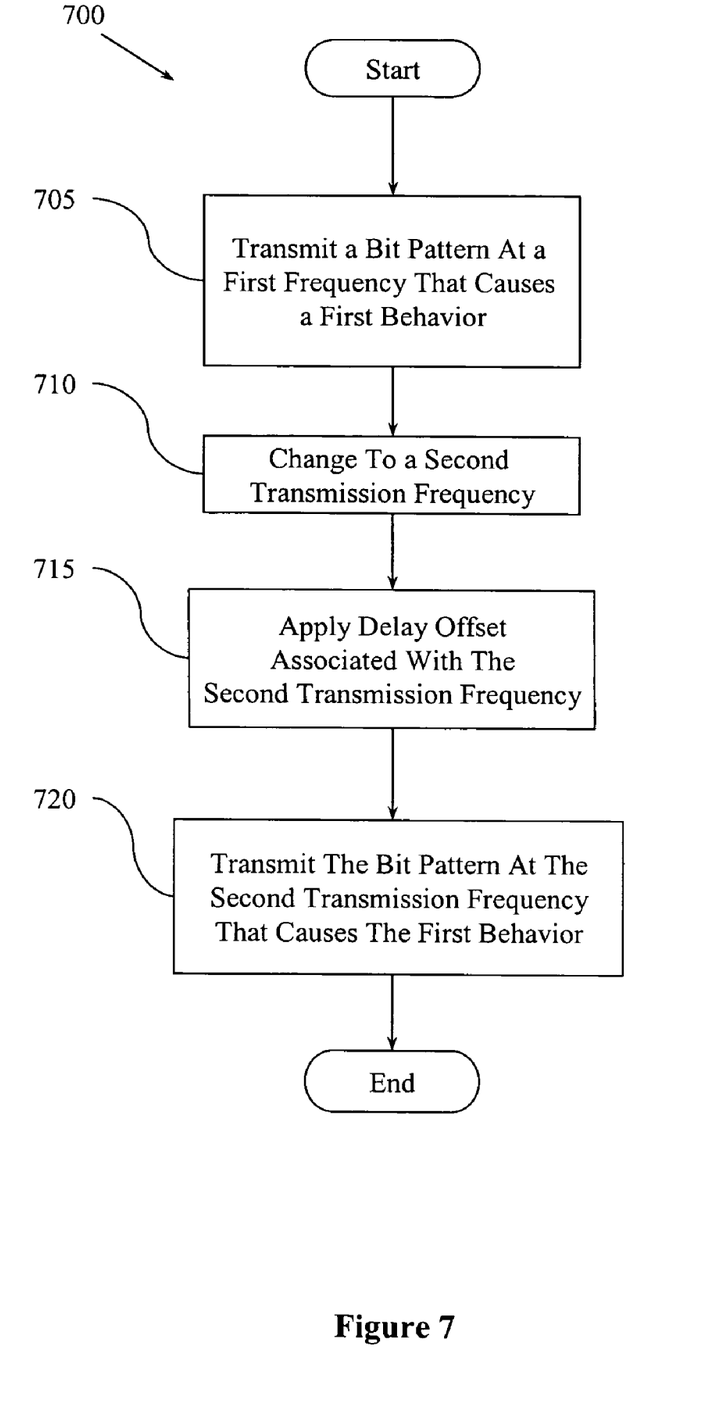
FIG. 7 illustrates an example methodology for testing a system using different operating frequencies.

Illustrated in FIG. 7 is an example methodology 700 that may be used for testing communications between two electronic components. For example, a bit pattern or test vector (e.g. stimuli) can be transmitted from a transmitting component to a receiving component at a first transmission frequency that causes a first behavior in the receiving component (Block 705). For example, the bit pattern acts as a stimulus to the receiving component. How the bit pattern is received (e.g., bits received on certain clock edges or cycles) is observed and can be compared to an expected response. Subsequently, system conditions can be changed such as changing to a different or a second transmission/operating frequency (Block 710). Rather than having to generate a new test vector or bit pattern, which can be time consuming, a delay offset can be applied that is associated with the second transmission frequency or based on the frequency range between the first and second transmission frequencies (Block 715).

The delay offset allows the same test vector or bit pattern to be transmitted (now at the second transmission frequency) that causes the first behavior to be observed in the receiving component (Block 720) and can be compared to the expected response. Internal components can be subjected to identical stimuli at different frequencies, as opposed to having the stimuli change at certain frequency points. Testing and debugging can be made easier when components behave in the same manner for a set of stimuli even when operating at wider ranges of frequencies.

Figure 8:
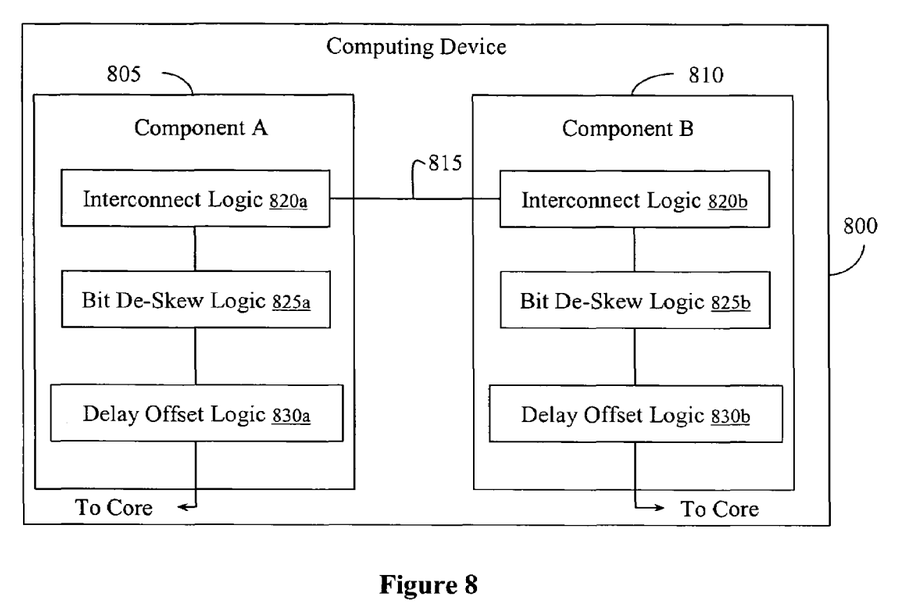
FIG. 8 illustrates one example of a computing device configured with delay offset logic.

Illustrated in FIG. 8 is an example computing device 800 that is configured to apply a delay offset to signals communicated between components to provide for repeatability in behavior. The computing device 800 can be, for example, a computer system, a portable computer, an image forming device with processing power, or any type of electronic device that includes signal communication between internal components. In one example, the computing device 800 can include a plurality of electronic components that may include at least a first component A 805 and a second component B 810 that are configured to communicate signals to each other over one or more point-to-point links 815. Examples of components may include, without limitation, a processor, a memory, a memory controller, other types of controllers, a chip, a circuit, or any type of logic device.

Each component A, B can include an interconnect logic 820a and 820b, respectively that are configured to control transmitting and receiving of the signals communicated over the point-to-point links 815. The interconnect logic 820a and 820b can be implemented with similar configurations and functions as described in other examples of the interconnect logics herein. A bit de-skew logic 825a and 825b can be operably connected to their corresponding interconnect logic 820a, 820b, respectively, and receive signals from each of the point-to-point links 815. The bit de-skew logic can be configured to re-align bit-to-bit skew that has been determined to occur over the links 815.

A delay offset logic 830a and 830b can be operably connected to their associated interconnect logic 820a, 820b, respectively, and are configured to selectively apply a frequency-based offset across signals received by the interconnect logic to create a total signal delay that is substantially constant for a selected transmission frequency range. The resulting signals can then be outputted to a core logic of the corresponding component for further processing. As previously described, one example of computing the total signal delay can be the time from when a signal is transmitted from component A and received by component B. Of course, the total signal delay can be computed in other ways based on a selected start and end point.

Any of the bit de-skew logics 825*a*, 825*b* and the delay offset logics 830*a*, 830*b* can be operably connected to their interconnect logic in a variety of ways. For example, one or more of the bit de-skew and/or the frequency delay logics may be internal and/or external to the interconnect logic 820*a*, 820*b*, or other desired configuration. In another example, the bit de-skew logic 825*a* and the delay offset logic 830*a* can be configured as a single component. One or more shift registers can be used to implement the bit de-skew and delay offset. Although not illustrated, logic can be included to implement a selector and selection logic as previously described. The selection logic (not shown) can be configured to control the delay offset logic 830*a*, or 830*b*, respectively to apply a selected frequency-based offset.

In one example, an amount of the frequency-based offset can be configured to increase as the signal transmission frequency increases and the link length of the point-to-point links 815 increases. In general, the amount of the frequency-based offset can be based on a transmission frequency range used for the components and a link length of the point-to-point links 815.

Optionally, the computing device 800 can be configured with a data store (not shown) that is configured to maintain one or more values for the frequency-based offset that is associated with different combinations of transmission frequency ranges and link lengths. As another example, by applying a selected delay offset, the system can cause the total signal delay to be substantially constant over different frequencies. By applying a first frequency-based offset when transmitting a test vector across the point-to-point links 815 at a first transmission frequency and by applying a second frequency-based offset when transmitting the test vector at a second transmission frequency, the same total signal delay can be achieved.

Figure 10:
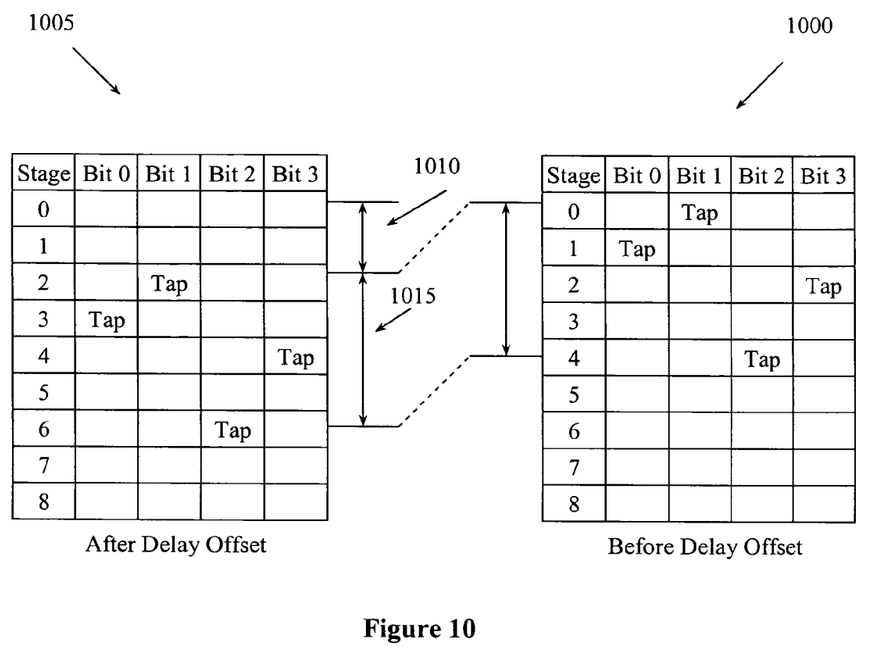
FIG. 10 illustrates an example shift register before and after a delay offset is applied.

Illustrated in FIG. 10 is an example showing two states of shift registers before and after a delay offset is applied. For example, shift register 1000 represents a before state and includes a 4-bit wide channel (bits 0–3) and is 9 bits deep (e.g., stages 0–8). One channel represents four shift registers such that each bit (e.g. 0–3) uses one shift register. Of course, different values and sizes can be used. Each bit column 0–3 represents one communication link and each column shows a selected "TAP" point that represents the location from which the bit-to-bit de-skew occurs.

At register 1005, it is shown in another state after a delay offset of two (2) bits is applied to all bits in the register 1000. The offset value of two (2) represents a repeatability delay shown as a shift 1010. The range of bit-to-bit de-skew is shown as area 1015. The maximum amount of delay offset will be limited by the depth of the register and how many shift locations (stages) are available at each end of the register. In the register 1000, at the top end, the "tap" is in Stage 0 which does not allow a delay offset to put it less than Stage 0. At the bottom end, the "tap" is in Stage 4 which allows a maximum of a four (4) bit shift for delay offset. Of course, a deeper register can be used to allow for greater values of the delay offset. Applying a delay offset like in the register 1005 can make a system repeatable over different operating frequencies. The bit skew area 1015 will vary depending on how much skew needs to be applied and as the area 1015 is made greater, the amount of stages available for repeatability offset becomes less.

With the above-described systems and methods, designing, manufacturing, testing, and/or debugging a chip or other logic device can be made easier when the chip has repeatable behavior over different operating frequencies. Applying a repeatability/delay offset can be simply implemented in existing bit-to-bit de-skew registers by making the registers deeper, or by using separate offset mechanisms such as one or more additional shift registers. In this manner, when a stimulus is applied to a chip or other logic device, it is desirable to get the same response on the same clock edges when the chip operates at different frequencies.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Additional advantages and modifications will readily appear to those skilled in the art. Therefore, the invention, in its broader aspects, is not limited to the specific details, the representative apparatus, and illustrative examples shown and described. Accordingly, departures may be made from such details without departing from the spirit or scope of the applicants' general inventive concept. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A system for receiving signals from an electronic component over a plurality of point-to-point communication links, the system comprising:
   a repeatability logic operably connected to each of the plurality of point-to-point communication links and configured to apply a delay offset to the signals received to compensate for frequency changes in signal transmissions over the plurality of point-to-point communication links; and
   a de-skew mechanism operably connected to each of the plurality of point-to-point communication links and configured to offset the signals received to re-align bits that are transmitted together.

2. The system of claim 1 including a shift register configured to implement the de-skew mechanism and the repeatability logic for each of the point-to-point links.

3. The system of claim 2 where the shift register is configured with a length being based on a transmission frequency range of the plurality of point-to-point communication links and a link length of the plurality of point-to-point communication links.

4. The system of claim 2 further including a selection logic configured to select a bit from a selected location from the shift register.

5. The system of claim 4 where the selection logic includes a multiplexer.

6. The system of claim 1 where the system is embedded within a packet assembler/disassembler.

7. The system of claim 1 where the repeatability logic is configured to selectively apply different values for the delay offset to each of the de-skew mechanisms equally to provide system repeatability for different signal transmission frequencies.

8. The system of claim 1 where each of the de-skew mechanisms include at least one shift register and the repeatability logic includes at least one separate shift register.

9. A system for receiving signals from an electronic component over a plurality of point-to-point communication links, the system comprising:
 a repeatability logic operably connected to each of the plurality of point-to-point communication links and configured to apply a delay offset to the signals received to compensate for frequency changes in signal transmissions over the plurality of point-to-point communication links where the repeatability logic is configured to be selectively enabled and disabled, and to apply changeable values for the delay offset to create a substantially constant total delay across the plurality of point-to-point communication links for different transmission frequency ranges and different link lengths.

10. The system of claim 9 further including a data store containing one or more offset values each associated with a selected transmission frequency range, where the delay offset is configured based on the one or more offset values and the selected transmission frequency range.

11. A computing device comprising:
 a plurality of electronic components including at least a first component and a second component that are configured to communicate signals to each other over point-to-point links;
 an interconnect logic configured within both the first component and the second component, the interconnect logic being configured to control transmitting and receiving of the signals communicated over the point-to-point links;
 a bit de-skew logic operably connected to the interconnect logic for receiving signals from each of the point-to-point links, the bit de-skew logic being configured to re-align bit-to-bit skew; and
 a delay offset logic operably connected to the interconnect logic and being configured to selectively apply a frequency-based offset across signals received by the interconnect logic to create a total signal delay that is substantially constant for a selected transmission frequency range.

12. The computing device of claim 11 where an amount of the frequency-based offset is configured to increase as signal transmission frequency increases and a link length of the point-to-point links increases.

13. The computing device of claim 11 where the bit de-skew logic and the delay offset logic are configured in a single shift register.

14. The computing device of claim 11 where the bit de-skew logic and the delay offset logic are configured using a plurality of shift registers.

15. The computing device of claim 11 where the frequency-based offset is based on the selected transmission frequency range and a link length of the point-to-point links.

16. The computing device of claim 15 further including a data store configured to maintain one or more values for the frequency-based offset for different combinations of a transmission frequency range and a link length.

17. The computing device of claim 11 where the system is configured to cause the total signal delay to be substantially constant by applying a first frequency-based offset when transmitting a test vector across the point-to-point links at a first transmission frequency, and by applying a second frequency-based offset when transmitting the test vector at a second transmission frequency.

18. The computing device of claim 11 further including a selection logic configured to control the delay offset logic to apply a selected frequency-based offset.

19. A method of configuring signal communication between two electronic components over point-to-point links, the method comprising:
 determining a bit-to-bit skew for bits transmitted over the point-to-point links;
 applying a bit-to-bit de-skew at a receiving end of the point-to-point links to re-align bits received;
 determining a frequency shift associated with one or more signal transmission frequencies used over the point-to-point links; and
 creating repeatable behavior for different signal transmission frequencies by configuring the receiving end of the point-to-point links by applying a delay offset to the bits received to compensate for the frequency shift for an associated signal transmission frequency.

20. The method of claim 19 further including testing the signal communication by:
 transmitting a bit pattern over the point-to-point links at a first transmission frequency that causes a first behavior at the receiving end;
 changing the first transmission frequency to a second transmission frequency;
 applying a delay offset associated with the second transmission frequency to the receiving end; and
 transmitting the bit pattern over the point-to-point links at the second transmission frequency that causes the first behavior at the receiving end.

21. The method of claim 19 further including selectively enabling and disabling the delay offset applied to the bits received.

22. The method of claim 19 further including determining the delay offset based on a transmission frequency range used and a link length of the point-to-point links between the two electronic components.

23. The method of claim 22 further including storing one or more values of the delay offset associated with different transmission frequencies and different link lengths.

24. The method of claim 19 where the creating repeatability applies the delay offset such that a total delay between the two electronic components is substantially constant for a frequency range.

25. The method of claim 24 where the total delay is based on a number of clock cycles.

26. A system for receiving signals over a point-to-point link comprising:
 means for applying a delay offset to the signals received to cause a total delay between components connected over the point-to-point link to be substantially constant for different transmission frequency ranges; and,
 a selection logic means for programmatically controlling the means for applying to apply a selected delay offset to the signals received.

27. The system of claim 26 where the means for applying is further configured to be selectively enabled and disabled.

28. The system of claim 26 further including means for determining the delay offset based on the selected transmission frequency range and a link length of the point-to-point link.

29. The system of claim 26 further including means for de-skewing bit-to-bit skew for the signals received.

30. The system of claim 29 where the means for de-skewing and the means for applying include one or more shift registers.

* * * * *

UNITED STATES PATENT AND TRADEMARK OFFICE
CERTIFICATE OF CORRECTION

PATENT NO.         : 7,289,587 B2                                          Page 1 of 1
APPLICATION NO. : 10/830367
DATED                : October 30, 2007
INVENTOR(S)      : Eric M. Rentschler et al.

It is certified that error appears in the above-identified patent and that said Letters Patent is hereby corrected as shown below:

In column 12, line 56, in Claim 2, after "implement" delete "the" and insert -- a --, therefor.

In column 13, line 5, in Claim 7, delete "each of the" and insert -- one or more --, therefor.

Signed and Sealed this

Second Day of September, 2008

JON W. DUDAS
*Director of the United States Patent and Trademark Office*